(12) United States Patent
Cornwell (10) Patent No.: US 8,200,151 B2
(45) Date of Patent: Jun. 12, 2012

(54) METHOD AND APPARATUS FOR ENHANCING SIGNAL CARRIER PERFORMANCE IN WIRELESS NETWORKS

(75) Inventor: James Cornwell, Irvine, CA (US)

(73) Assignee: Kaonetics Technologies, Inc., Inyok-Gru, CA (US)

( * ) Notice: Subject to any disclaimer, the term of this patent is extended or adjusted under 35 U.S.C. 154(b) by 687 days.

(21) Appl. No.: 12/269,878

(22) Filed: Nov. 12, 2008

(65) Prior Publication Data

US 2009/0124217 A1 May 14, 2009

Related U.S. Application Data

(60) Provisional application No. 60/987,191, filed on Nov. 12, 2007, provisional application No. 60/987,691, filed on Nov. 13, 2007.

(51) Int. Cl.
*H04B 7/24* (2006.01)

(52) U.S. Cl. ....... 455/39; 455/260; 455/422.1; 313/309; 313/495; 313/336; 313/306; 313/292

(58) Field of Classification Search .............. 455/41.3, 455/42–43, 501, 63.4, 102; 250/492.21, 250/309; 313/309, 495, 336, 306, 310
See application file for complete search history.

(56) References Cited

U.S. PATENT DOCUMENTS

| | | | |
|---|---|---|---|
| 3,238,531 A * | 3/1966 | Kaufman et al. ............. 343/701 |
| 4,975,917 A * | 12/1990 | Villa ................................ 372/5 |
| 5,054,046 A | 10/1991 | Shoulders | |
| 5,054,047 A | 10/1991 | Shoulders | |
| 5,365,927 A | 11/1994 | Roemer | |
| 5,468,955 A * | 11/1995 | Chen et al. .................... 250/251 |
| 5,594,296 A | 1/1997 | Mitsutake et al. | |
| 5,682,412 A | 10/1997 | Skillicorn et al. | |
| 5,912,469 A | 6/1999 | Okino | |
| 6,124,596 A | 9/2000 | Nakasuji | |
| 6,567,685 B2 | 5/2003 | Takamori | |
| 6,657,594 B2 | 12/2003 | Anderson | |

(Continued)

FOREIGN PATENT DOCUMENTS

CN 2155600 2/1994

(Continued)

OTHER PUBLICATIONS

Notification of Transmittal of the International Search Report and the Written Opinion of the International Searching Authority (Forms PCT/ISA/220, PCT/ISA/210 and PCT/ISA/237) from International Application No. PCT/US2008/012831 dated Feb. 19, 2009 corresponding to U.S. Appl. No. 12/271,682.

(Continued)

*Primary Examiner* — Edward Urban
*Assistant Examiner* — Ganiyu Hanidu
(74) *Attorney, Agent, or Firm* — Steven Vosen (57) ABSTRACT

A wireless communications system can include a charged particle generator configured to generate plural energized particles and a charge transformer configured to receive the plural energized particles that include charged particles from the charged particle generator and to output energized particles that include particles having substantially zero charge. The charged particle generator can be configured to direct the plural energized particles through the charge transformer to propagate through free space until received by a broadband signal receiver that can demodulate a data signal to complete the data communication.

17 Claims, 5 Drawing Sheets

U.S. PATENT DOCUMENTS

| | | | |
|---|---|---|---|
| 6,756,930 | B1 | 6/2004 | Nunuparov et al. |
| 6,784,408 | B1 | 8/2004 | Cheung et al. |
| 6,809,307 | B2 | 10/2004 | Byren et al. |
| 6,849,841 | B2 | 2/2005 | Byren et al. |
| 6,864,825 | B2 * | 3/2005 | Holly ............................. 342/13 |
| 7,061,241 | B2 | 6/2006 | Le Roux |
| 7,098,662 | B2 | 8/2006 | Hinks et al. |
| 7,126,530 | B2 * | 10/2006 | Brown .......................... 342/359 |
| 7,221,329 | B2 | 5/2007 | Cornwell |
| 7,899,105 | B1 * | 3/2011 | Hargis et al. .................. 372/102 |
| 2003/0179784 | A1 | 9/2003 | Minehara et al. |
| 2007/0259641 | A1 * | 11/2007 | Gorrell et al. ................. 455/260 |
| 2007/0273244 | A1 | 11/2007 | Lal et al. |

FOREIGN PATENT DOCUMENTS

| | | |
|---|---|---|
| EP | 1372104 | 12/2003 |
| GB | 2429592 | 2/2007 |
| JP | 07-235257 | 9/1995 |
| WO | 2006086658 A1 | 8/2006 |

OTHER PUBLICATIONS

International Search Report and Written Opinion dated May 19, 2009 from International Application No. PCT/US2008/012673 corresponding to U.S. Appl. No. 12/269,880.

International Search Report and Written Opinion dated May 29, 2009 from International Application No. PCT/US2008/012843 corresponding to U.S. Appl. No. 12/272,394.

International Search Report and Written Opinion dated May 25, 2009 from International Application No. PCT/US2008/012678 corresponding to U.S. Appl. No. 12/269,876.

International Search Report and Written Opinion dated Jun. 11, 2009 from International Application No. PCT/US2008/012672 corresponding to U.S. Appl. No. 12/269,878.

Cornwell, Copending U.S. Appl. No. 12/269,876 filed Nov. 12, 2008 entitled "Directed-Energy System and Methods for Disrupting Electronic Circuits".

Cornwell, Copending U.S. Appl. No. 12/271,682 filed Nov. 14, 2008 entitled "Wireless Identification System Using a Directed-Energy Device as a Tag Reader".

Cornwell, Copending U.S. Appl. No. 12/269,880 filed Nov. 12, 2008 entitled "Method of Producing a Highly Permeable Stable RF Wavefront Suitable as a Data Carrier".

Cornwell, Copending U.S. Appl. No. 12/272,394 filed Nov. 17, 2008 entitled "Directed-Energy Imaging System".

Supplementary Search Report issued on Apr. 8, 2011 in European Patent Appln. No. 08850425.3.

* cited by examiner

METHOD AND APPARATUS FOR ENHANCING SIGNAL CARRIER PERFORMANCE IN WIRELESS NETWORKS

CROSS-REFERENCE TO RELATED APPLICATIONS

This application claims priority from U.S. Provisional Patent Application Ser. Nos. 60/987,191, filed Nov. 12, 2007, and 60/987,691, filed Nov. 13, 2007, the disclosures of which are hereby incorporated by reference in their entirety. The disclosure of U.S. Provisional Patent Application Ser. No. 61/113,847, filed Nov. 12, 2008 is hereby incorporated by reference in its entirety.

PCT International Pub. No. WO2006/086658 titled "Antenna System," which is a continuation of International Application Number PCT/US2006/004779, filed Feb. 13, 2006, is incorporated by reference herein in its entirety. U.S. Pat. No. 7,221,329 titled "Enhanced Beam Antenna," dated May 22, 2007, is also incorporated by reference herein in its entirety. The disclosure of U.S. Provisional Patent Application Ser. No. 61/113,847, filed Nov. 12, 2008 is hereby incorporated by reference in its entirety.

BACKGROUND

1. Field

The subject matter presented herein relates generally to wireless network communications systems, and more particularly, to a wireless communications network featuring enhanced signal carrier performance by the modulation of electromagnetic waves at, e.g., ultra high frequencies using a particle beam and a charge transformer.

2. Description of Related Art

Known communications systems can feature the transmission of a signal using a carrier frequency that has been modulated in, for example, either the amplitude or time domains, or a combination of both in frequency, phase and amplitude modulation, whether digital or analog modulation schemes. Such a signal can be typically provided with data that is fed to a modulator that alters the amplitude, frequency or phase of a sinusoidal or other modulated electronic signal that is then fed to an antenna as a time-varying voltage and/or current. Depending on the power levels and antenna configuration, a particular radiation pattern can be generated that propagates through space and can be detected and amplified by a receiver tuned to a same frequency.

Many such systems can be typically characterized as having an operating frequency in the radio frequency (RF) bands from about 50 KHz to 3 GHz. These bands can be highly regulated by government agencies to ensure that operations in one frequency band interfere with operations in another frequency band. Also, due to the limited number of frequency bands available, such bands can be expensive to license.

SUMMARY

In an exemplary embodiment, a method of communicating can comprise generating a data signal to be communicated; generating a high frequency carrier signal; combining the high frequency carrier signal with the data signal to create a modulated RF signal; transmitting the modulated RF signal to at least one directional antenna that is oriented in a principal plane; amplifying the modulated RF signal to a high enough voltage such that ionic fields are created at the edge of the directional antenna; increasing the voltage further to induce discharge arcing on at least one edge of the directional antenna, thereby creating a modulated particle beam that is oriented in the principal plane of the directional antenna; and directing the modulated particle beam to impinge upon an incident surface of a charge transformer; inducing the creation of radiated modulated electromagnetic (EM) waves such that the modulated EM waves are received in a receiver for demodulating the modulated EM waves in the receiver and extracting the data signal.

In an exemplary embodiment, a communications system can comprise a charged particle generator configured to generate plural energized particles; and a charge transformer configured to receive the plural energized particles that include charged particles from the charged particle generator and to output energized particles that include particles having substantially zero charge, wherein the charged particle generator is configured to direct the plural energized particles through the charge transformer such that they can be received in a receiver.

BRIEF DESCRIPTION OF DRAWINGS

As will be realized, different embodiments are possible, and the details disclosed herein are capable of modification in various respects, all without departing from the scope of the claims. Accordingly, the drawings and descriptions are to be regarded as illustrative in nature and not as restrictive. Like reference numerals have been used to designate like elements.

DETAILED DESCRIPTION

Figure 1:
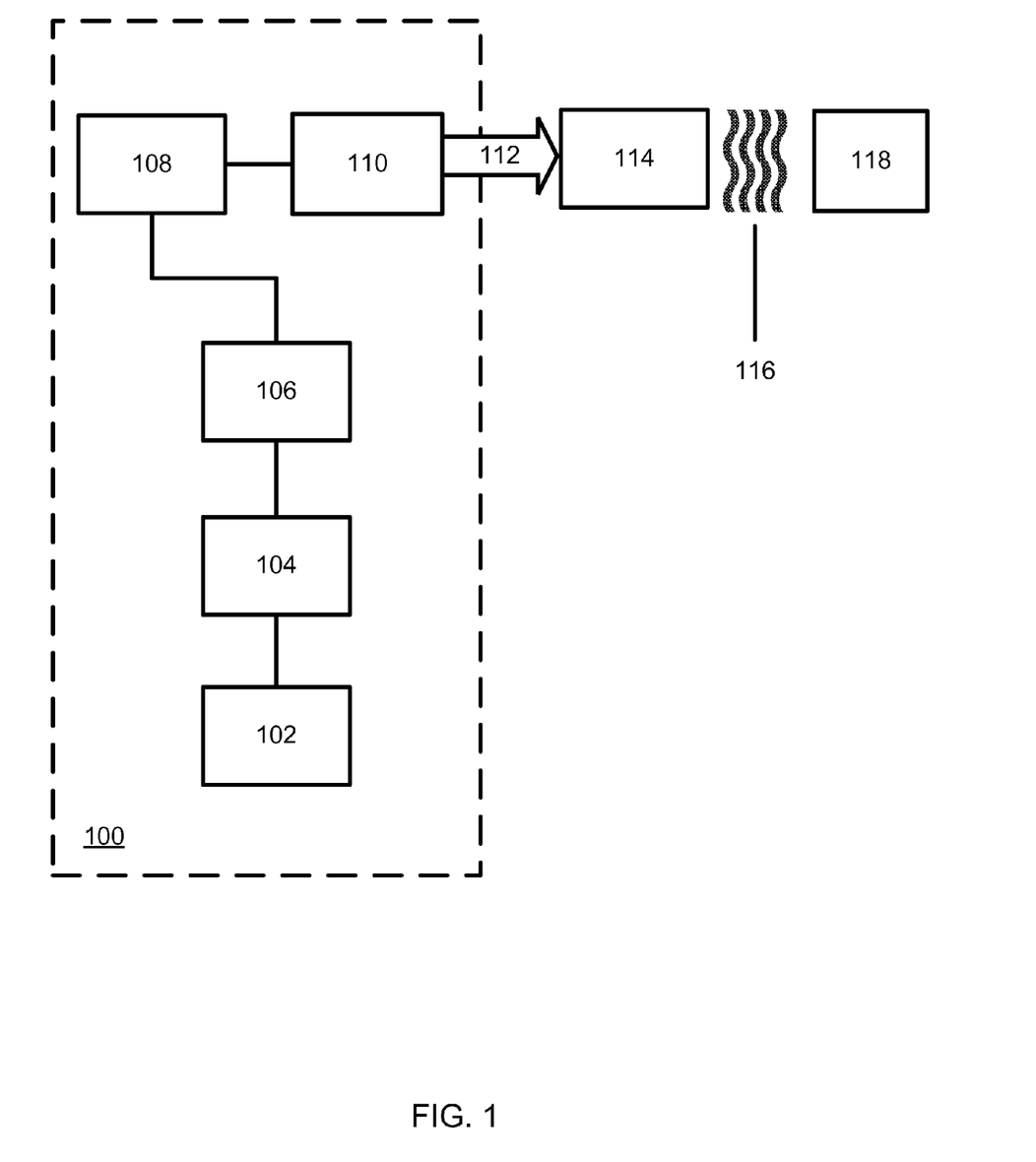
FIG. 1 shows a functional block diagram of an exemplary embodiment of a wireless communications system.
Figure 2:
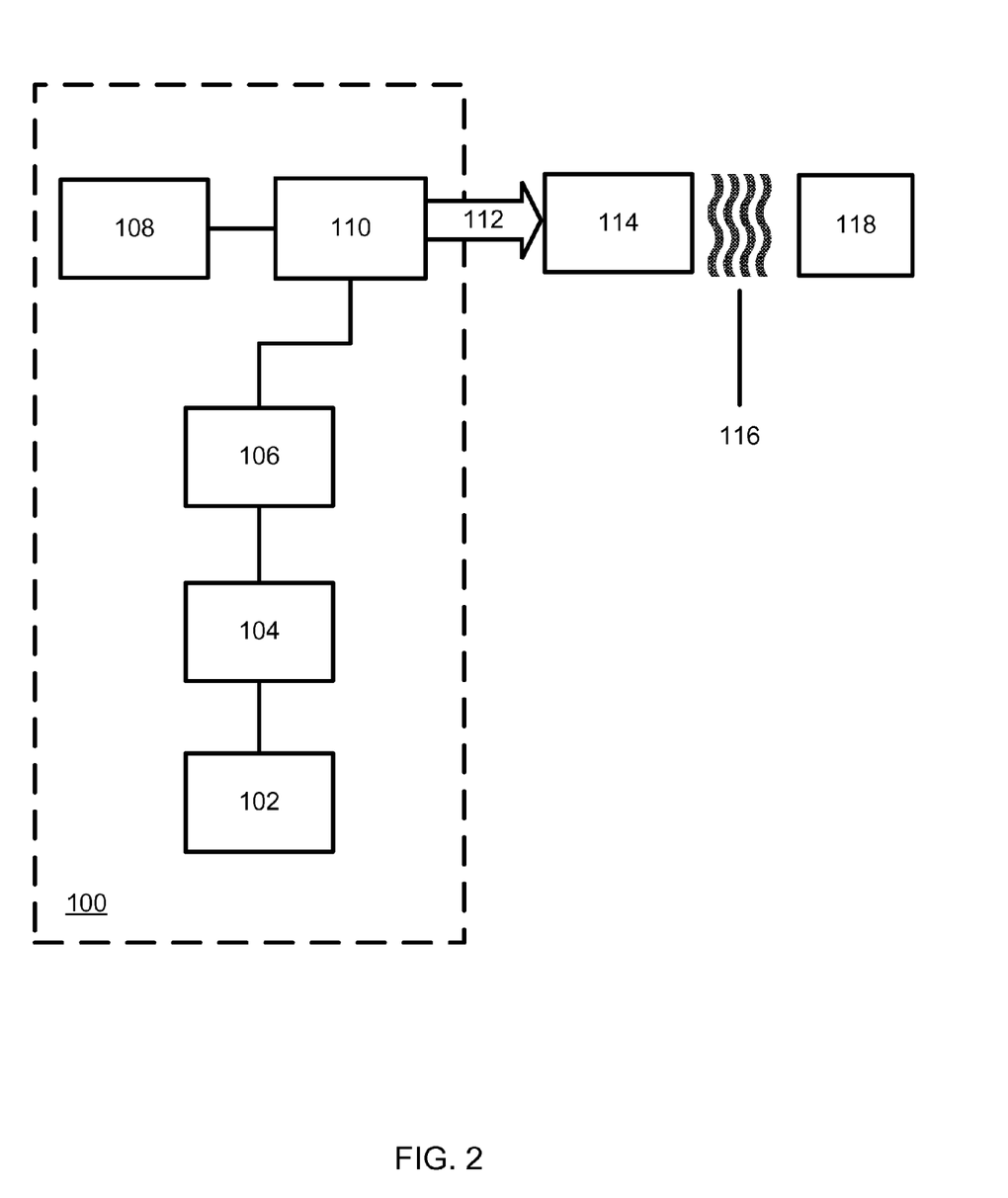
FIG. 2 shows a block diagram of an alternate embodiment of a wireless communications system.
Figure 3:
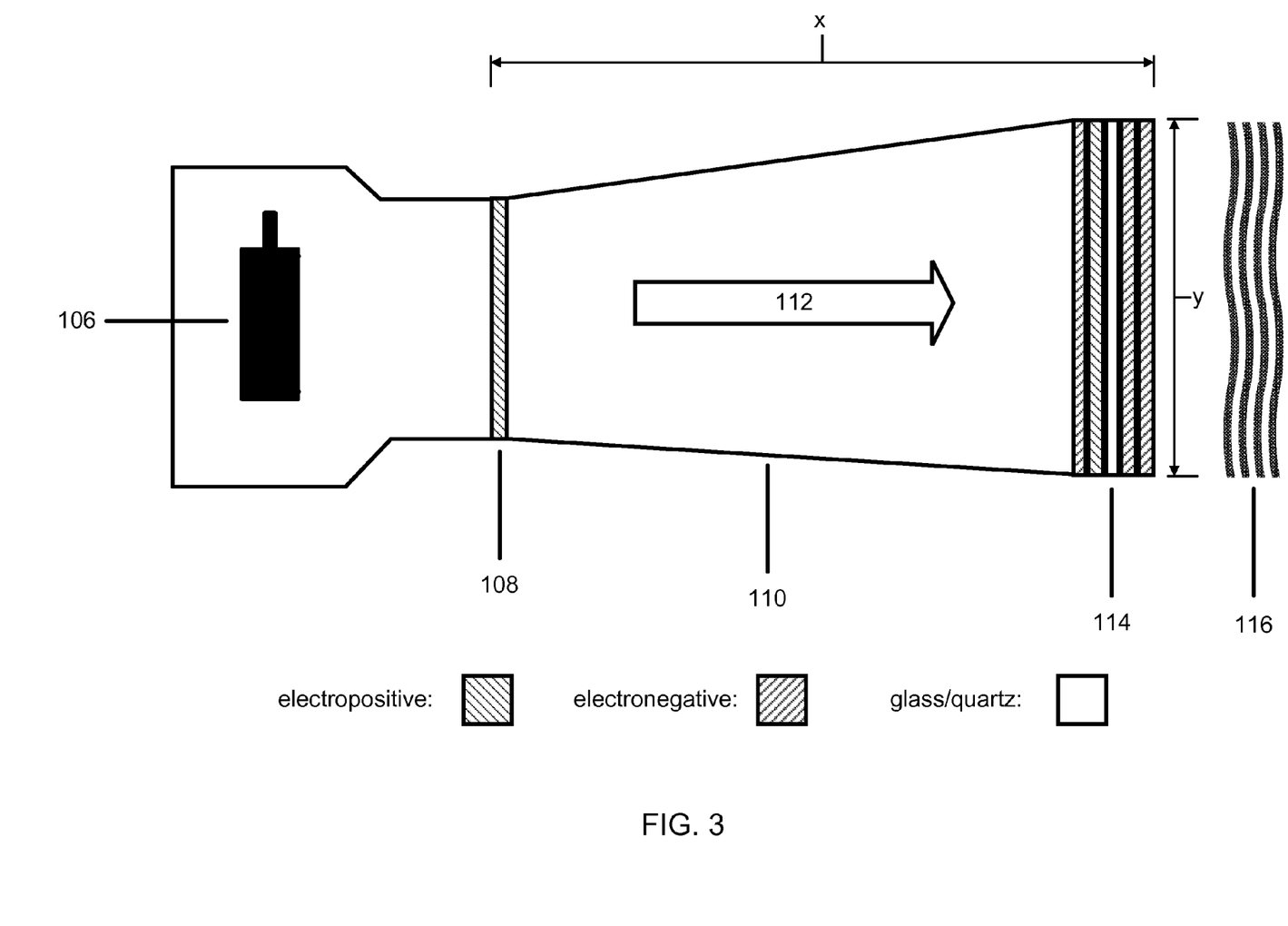
FIG. 3 shows a simplified cross-sectional view of portions of an exemplary embodiment of a wireless communications system.

Referring to FIGS. 1, 2 and 3, exemplary embodiments of a wireless communications system can include a charged particle generator 100 configured to generate plural energized particles and a charge transformer 114 configured to receive the plural energized particles that include charged particles from the charged particle generator and to output energized particles that include particles having substantially zero charge. The charged particle generator 100 can be configured to direct the plural energized particles through the charge transformer 114 to propagate through free space until received by a broadband signal receiver 118, for example, which can demodulate a data signal to complete the data communication.

In an exemplary embodiment, the plural energized particles can be in the form of a photon particle wave, e.g., a mixture or cross-generation of photons and electrons.

Power and control components will be known to those of skill in the art. For example, in an exemplary embodiment, energized particle generator 100 can include a DC power supply 102 and DC-to-AC converter 104.

In an exemplary embodiment, charged particle generator 100 can include charged particle emitter 106. In an embodiment, charged particle emitter 106 can include any suitable source of electromagnetic (EM) energy, particularly microwaves. In some embodiments, charged particle emitter 106 may include known magnetrons. In some other embodiments, charged particle emitter 106 may include solid-state power amplifiers, gyrotrons, traveling wave tubes (TWTs), and/or klystrons. In some embodiments, charged particle emitter 106 may be a lower-power source and may generate energy levels of approximately 1 kilowatt (kW) to approximately 100 kW or greater, although the scope is not limited in this respect.

In an exemplary embodiment, in charged particle emitter 106, an RF data signal to be communicated can be formed using known wireless communications techniques. This RF data signal can then be transmitted to a plurality of directional antenna devices, for example, which may be included in waveguide 110. By the amplification of the RF data signal to a very high signal voltage and subsequent application of this amplified RF data signal to the directional antenna devices, an ionic discharge at the antennas can occurs that can transform the RF data signal into a directed particle beam.

In an embodiment, waveguide 110 can be configured to minimize backscatter of the energized particles using known techniques. For example, using a plurality of backscatter reflectors, which can be included in waveguide 110 in proximity to the directional antennas, the particle beam can then be further focused and directed via waveguide 110 as an electromagnetic wavefront 112 to impinge on the surface of charge transformer 114.

Without limiting the scope of the invention, other examples of suitable charged particle emitters that can form a photon particle wave include known energy emission devices such as free electron lasers and discharges or arcs at edges of planar antennae, for example, spark gap generators.

In some embodiments, charged particle emitter 106 may include a free electron laser, or FEL. A FEL is a laser that shares the same optical properties as conventional lasers such as emitting a beam consisting of coherent electromagnetic radiation which can reach high power, but which uses some very different operating principles to form the beam. Unlike gas, liquid, or solid-state lasers such as diode lasers, which rely on bound atomic or molecular states, FELs use a relativistic electron beam as the lasing medium, hence the term free electron. This gives them a wide frequency range compared to other laser types, and makes many of them widely tunable, currently ranging in wavelength from microwaves, through terahertz radiation and infrared, to the visible spectrum, to ultraviolet, to soft X-rays.

In an exemplary embodiment, charged particle emitter 106 can include an excitation signal, produced by known signal generation devices, for example. Such an excitation signal could be a 120 VAC clipped (square) wave that can have an effect of driving a magnetron outside of a typical 2.45 GHz frequency, for example. In an embodiment, when a 120 VAC square wave excitation signal is applied to a magnetron, bandwidths on the order of 0 to 10 GHz can be achieved.

In an exemplary embodiment, the output of charged particle emitter 106 can be a photon particle wave that can include a mixture of photons and electrons.

In an exemplary embodiment, charged particle generator 100 can include an energized particle, e.g., photon and/or particle beam or wave, forming module 108. In an exemplary embodiment, energized particle (photon particle beam or wave) forming module 108 can be positioned in a throat section of a waveguide launcher between charged particle emitter 106 and waveguide 110.

In an exemplary embodiment, energized particle forming module 108 can be made of an electropositive material, such as a polycarbonate sheet. In an embodiment, this material can include DELRIN manufactured by DuPont. In an embodiment, energized particle forming module 108 can act like a roughing filter, i.e., it can start the process of reducing the charge of the charged particles in the mixture of photons and electrons. After passing through energized particle forming module 108, the mixture of photons and electrons can then be directed via waveguide 110 as an electromagnetic wavefront 112 to impinge on the surface of charge transformer 114.

In an exemplary embodiment, waveguide 110 can include a hollow conducting tube, which may be rectangular or circular, for example, within which EM waves can be propagated. Signals can propagate within the confines of metallic walls, for example, that act as boundaries.

In an exemplary embodiment, waveguide 110 can be configured as a circularly polarized antenna and may radiate substantially circularly polarized energy. In other embodiments, waveguide 110 may be linearly polarized and may radiate signals with a linear polarization (e.g., a horizontal and/or a vertical polarization). Antennas in many shapes, such as horns, lenses, planar arrays, and reflectors may be suitable in some of these embodiments.

As shown in FIG. 3, exemplary waveguide 110 can be configured as part of a device that can include a magnetron portion, a throat section of a waveguide launcher area that can include energized particle forming module 108 positioned between charged particle emitter 106 and waveguide 110, and a cone-like portion or horn. In an exemplary embodiment, a magnetron can be placed in the magnetron portion such that there can be a three-inch gap between the top of the magnetron's cathode and the top of the enclosure.

In an exemplary and non-limiting embodiment, waveguide 110 can be designed to promote sufficient velocity of the photon particle wave that can include a mixture of photons and electrons particles, here designated as EM wavefront 112, moving through the waveguide 110. Again referring to FIG. 3, x refers to a length of exemplary waveguide 110 (which can include energized particle forming module 108) and y refers to a height of an aperture opening at the end of waveguide 110. In an exemplary embodiment, the ratio of x/y can be approximately 3 to 3.5 to 1 to promote sufficient velocity of the particles moving through the waveguide 110. For example, assuming that the aperture opening height (y) is six inches, then waveguide 110 length can be from 18 to 21 inches. In another embodiment, a length of waveguide 110 can be based on the ratio of six times the air gap above an exemplary magnetron's cathode. Using the previously mentioned three-inch gap, this results in a waveguide length of eighteen inches.

In an exemplary embodiment, the aperture opening can be generally rectangular. In an embodiment, the aperture opening width can be eight inches for an aperture opening height (y) of six inches. In an exemplary embodiment, the length of the launcher area before the waveguide 110 can be approximately two inches.

In an exemplary embodiment, the interior surface of exemplary waveguide 110 can be coated with approximately two mils (0.002 inches) of a noble metal, such as 14-carat gold. Other noble metals can include ruthenium, rhodium, palladium, osmium, iridium and platinum. Such a coating can improve the gain characteristics of waveguide 110. An example of a suitable coating process that can be used to enhance the performance of antennas or waveguides may be found in U.S. Pat. No. 7,221,329, the disclosure of which is hereby incorporated by reference in its entirety.

In an exemplary embodiment, EM wavefront 112 can be directed through charge transformer 114. In an embodiment, charge transformer 112 can have dielectric and physical characteristics such that the energized charged particles, e.g., electrons, in an EM wavefront 112 can be transformed. While not wishing to be bound by any particular theory, this may be done either by changing characteristics of the particle, or by generation or emission of different particles as a result thereof, thereby creating a wavefront 116 at the output of the charge transformer 114. Wavefront 116 can have the modulation properties of the original RF data signal and propagate through free space until received by broadband signal receiver 118, for example, which can demodulate a data signal to complete the data communication.

In an exemplary embodiment, a 600 W magnetron can produce a wavefront 116 of about 10 mW/cm2 at the aperture, which can result in about 2 mW/cm2 at 1 meter from the aperture.

In an exemplary embodiment, charge transformer 114 can include an incident surface for receiving the EM wavefront 112 and an exit surface for radiating the wavefront 116.

In an exemplary embodiment, charge transformer 114 can include a composite of glass and/or polycarbonate materials, for example, and can vary in shape. For example, flat plates or panes with parallel surfaces can be used as well as convex lenses of a desired focal length. Hybrid configurations with parallel surfaces at the center and convex surfaces at the edges can also be acceptable configurations.

Referring to FIG. 3, in an exemplary embodiment, charge transformer 114 can include at least one electronegative/electropositive material pair, i.e., an electronegative layer next to an electropositive layer, or vice versa, that first receives EM wavefront 112, followed by approximately ½ inch of glass or quartz, followed by two electronegative layers. In an exemplary embodiment, this assembly of layers can be vacuum-sealed in ABS plastic.

Suitable materials for the electronegative/electropositive material pair can include known materials that can exhibit electronegative/electropositive behavior. As previously mentioned, an electropositive material can include a polycarbonate sheet made of DELRIN, for example. Suitable polycarbonate can also be chosen for electronegative layers. In another embodiment, plate glass can be sputtered with metal oxides to achieve desired electronegative/electropositive behavior.

In an exemplary embodiment, the approximately ½ inch of glass layer can include leaded glass if additional dampening of the emitted zero-charge particle stream is desired.

In an exemplary embodiment, there can be plural pairs of electronegative/electropositive material that first receives EM wavefront 112 followed by a glass or quartz layer.

In an exemplary embodiment, horizontal and/or vertical slits or other openings can be formed into or cut out of charge transformer 114 so that in addition to wavefront 116 propagating from charge transformer 114, charged particles in EM wavefront 112 can also propagate from the device. A controlled amount of charged particles along with wavefront 116 may be useful depending on the operating environment. In an exemplary embodiment, the slits or other openings may be adjustable by an operator using known methods and/or materials. For example, tape, a slide mechanism, or an aperture mechanism could be used to adjust the slits.

Charge transformer 114 may incorporate known coating materials or multiple deposition layers on either the incident surface or the exit surface to aid in the wavefront 116 generation, and/or have abrasion or polishing performed on either surface to enhance desired characteristics of the charge transformer 114. Similarly, side surfaces may have similar operations performed to enhance the desired charge transformer 114 characteristics. Other compositions materials and combinations of materials may be used in the fabrication of the charge transformer 114 to achieve desired transformation effects. Additionally, other geometries may be used for charge transformer 114, including, without limitation, stacking additional charge transformer components in combinations that may reflect, refract or redirect EM wavefront 112.

In an exemplary embodiment, wavefront 116, after exiting charge transformer 114, is shown in FIGS. 1 and 2 propagating through free space until received by a broadband signal receiver 118, for example, which can demodulate a data signal to complete the data communication.

In an exemplary embodiment, a sighting device, such as a laser, rifle scope or sight, can be incorporated into an exemplary directed-energy system and used to help direct the wavefront 116.

Transforming the plural energized particles within the charge transformer can include laterally aligning the plural energized particles to produce a polarization of the plural energized particles. The plural energized particles can be generated by cross-generation of photons and electrons.

Various system components described above may be resized depending on the system parameters desired. For example, charge transformer 114 and waveguide 110 can be made larger or smaller and can have different dimensions and geometries depending, for example, on the power or distance requirements of a particular application. Additionally, an exemplary charged particle emitter 106 may be configured by those skilled in the art to have multiple voltages, frequencies, and power levels.

The precise theory of operation of the charged particle generator 100 in combination with the charge transformer 114 may not be not entirely understood. Without wishing to be bound by any theory, it is believed that the charge transformer 114 reduces the charge in the EM wavefront 112. Based on empirical data to date, it has been determined through experimentation, using, for example, exemplary embodiments described herein, that the particles in wavefront 116 are at a zero-charge state and approximately the same mass as an electron ($9.10938188 \times 10^{-31}$ kilograms).

While reiterating that the precise theory of operation is not entirely understood, it is believed that the effect is such that when a wavefront of exemplary zero-charge particles with sufficient energy density impinges a circuit, for example, the kinetic energy of the particles, rather than an associated electromagnetic charge, causes a resonant frequency. This resonant frequency may cause mechanical or physical oscillations, for instance.

In an exemplary embodiment, directional planar antennas, as described in the referenced PCT International Pub. No. WO2006/086658 titled "Antenna System," can be used to create and focus a directed particle beam, thereby enhancing signal carrier performance in a wireless communications system. A brief description of an example of one such antenna will be described to aid in the understanding of the embodiments disclosed herein.

Typically, an antenna can include a first insulating substrate extending in the principal plane of the antenna. The antenna can further include a first radiating element and a connected first conductor and can include a second radiating element and a connected second conductor. The antenna can further include a coupling conductor coupling the second radiating element and the first conductor. The first antenna can further includes a first coupler having a first signal conductor and a second signal conductor. The first signal conductor can be coupled to the second conductor, and the second signal conductor can be coupled to the first radiating element.

In an exemplary embodiment, when RF signal currents are applied between the first and second signal conductors, radiating elements can resonate and operate as an antenna. The radiation that emanates from a radiating element can tend to emanate from the edge of the element, e.g., the edge of an etched copper, generally flat, shape. By incorporating a plurality of such antennas, each having a different principal plane or orientation, and where each may have a custom configuration, a composite radiation field pattern can be shaped and made highly directional. Each antenna configuration may be varied by size and shape to meet frequency requirements and impedance matching requirements according to known "patch radiator" technology. Such directional radiation effects can be incorporated in the embodiments disclosed herein.

FIG. 2 also shows another embodiment of a wireless communications system, similar to the FIG. 1 embodiment. Unlike the FIG. 1 embodiment, the modulated RF data signal can be transmitted to waveguide 110 to be impressed on a directed particle beam that has not been modulated with a data signal. The directed particle beam of this alternate embodiment can be generated by inducing ionic discharge arcing at the edges of the plurality of antennas in waveguide 110 by applying a very high voltage unmodulated carrier signal similar to the FIG. 1 embodiment, but without including the data modulation signal.

The un-modulated directed particle beam can traverse waveguide 110, wherein the modulated RF data signal from charged particle emitter 106 that has been amplified to create an E-field across the inner surfaces of waveguide 110 can impress the data modulation signal upon the directed particle beam to create EM wavefront 112 as in the FIG. 1 embodiment. As described in the FIG. 1 embodiment, EM wavefront 112 can then impinge on the surface of charge transformer 114, which can wavefront 116 that can be transmitted to receiver 118, which demodulates the data signal to complete the data communication.

In an exemplary embodiment, receiver 118 can be configured substantially same as shown in FIG. 3. A difference could be that in place of a magnetron, for example, a frequency downconverter using a pendulum, for example, can be configured to receive the zero-charge particles. As previously mentioned, the kinetic energy of the particles, rather than an associated electromagnetic charge, can cause a resonant frequency. This resonant frequency may cause mechanical or physical oscillations, which may be converted by an exemplary frequency downconverter using a pendulum. The resulting signal can then be output to a suitable analyzer, for example.

Figure 4:
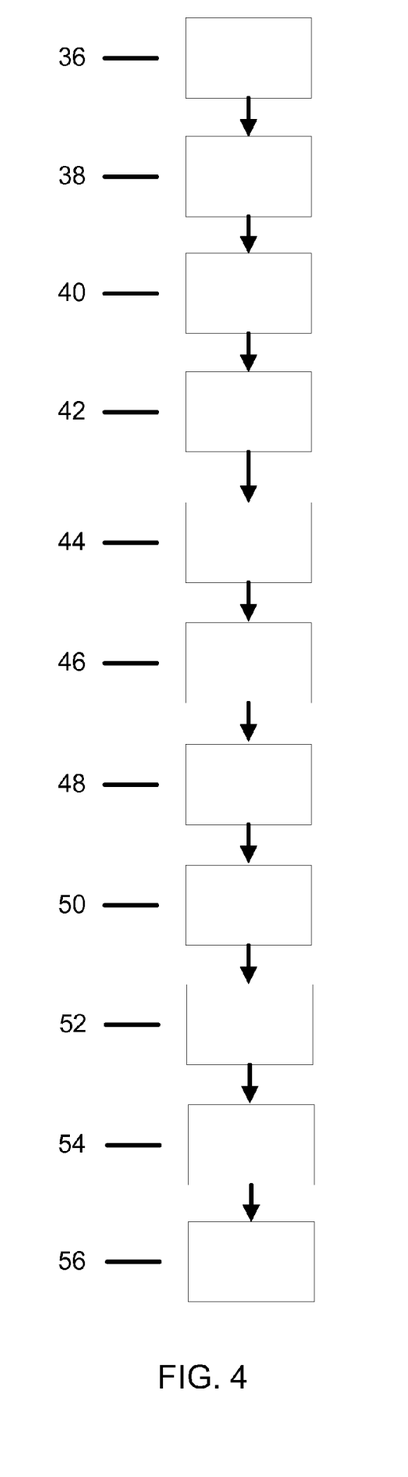
FIG. 4 shows a flow chart for an exemplary method for improved communications.

Referring to FIG. 4, an exemplary method for communicating a data signal can include:
36. generating a data signal to be communicated;
38. generating a high frequency carrier signal;
40. combining the high frequency carrier signal with the data signal to create a modulated RF signal;
42. transmitting the modulated RF signal to at least one directional antenna that is oriented in a principal plane;
44. amplifying the modulated RF signal to a high enough voltage such that ionic fields are created at the edge of the directional antenna;
45. increasing the voltage further to induce discharge arcing on at least one edge of the directional antenna, thereby creating a modulated particle beam that is oriented in the principal plane of the directional antenna;
48. directing the modulated particle beam to impinge upon an incident surface of a charge transformer;
50. slowing the electrons of the particle beam within the charge transformer to induce the creation of radiated modulated EM waves;
52. receiving the modulated EM waves in a receiver;
54. demodulating the modulated EM waves in the receiver;
56. extracting the data signal.

Figure 5:
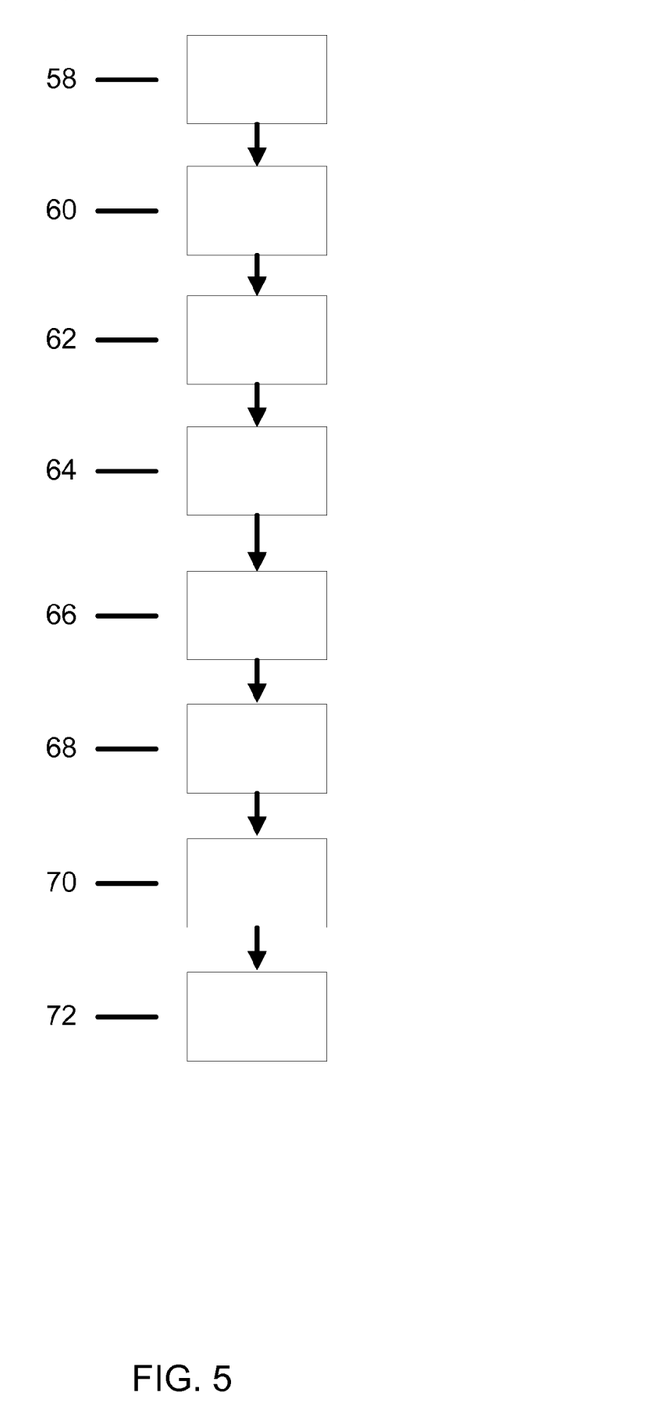
FIG. 5 shows a flow chart for another exemplary method for improved communications.

Referring to FIG. 5, another exemplary method for communicating a data signal can include:
58. generating an un-modulated particle beam, further comprising generating a high frequency carrier signal; transmitting the high frequency carrier signal to at least one directional antenna that is oriented in a principal plane; amplifying the high frequency carrier signal to a high voltage such that ionic fields are created at the edge of the directional antenna; and increasing the voltage further to induce discharge arcing on at least one edge of the directional antenna, thereby creating an un-modulated particle beam that is oriented in the principal plane of the directional antenna;
60. generating a modulated data signal, further comprising generating a data signal to be communicated; and modulating the data signal;
62. combining the modulated data signal and the un-modulated particle beam to create a modulated particle beam;
64. directing the modulated particle beam to impinge upon an incident surface of a charge transformer;
66. slowing the electrons of the particle beam within the charge transformer to induce radiated modulated EM waves;
68. receiving the modulated EM waves in a receiver;
70. demodulating the modulated EM waves in the receiver; and
72. extracting the data signal.

In an exemplary embodiment, a communication system can feature enhanced signal carrier performance by using a particle generator to excite a plurality of ionized particles to an excitation level that can be uniquely associated with the data signal being transmitted. The ionized particles can then be transmitted via a directional antenna through a waveguide and can be directed toward a charge transformer that has a dielectric property such that the electrons of the excited particle beam can be, thereby creating a continuous electromagnetic (EM) wave at the output of the charge transformer that propagates toward and is received by a receiver. An advantage of such a particle beam device is that the generated EM wave can be extremely broadband in nature and can allow communications systems to operate at frequencies up to 21 GHz, for example, which can be significantly above the spectrum of known RF bands. These higher bands can be relatively unpopulated and may be unregulated.

The particle generator can include a plurality of antennas and reflectors, where each of the antennas can feature a generally planar design that can be excited to a high enough voltage to ionize the surrounding atmosphere and thus induce discharge arcing at the periphery of the antenna, thereby creating a broadband particle beam that can be directional in the plane of the antenna and can be further focused using the reflectors into a particle beam in a principal direction.

More specifically, each antenna within the particle generator can be generally different than the other antennae within the particle generator, with each antenna being characterized by a principal plane. A principal plane of a first antenna can be oblique to a principal plane of a second antenna, and the second antenna can have a principal plane that is oblique to a principal plane of a third antenna, etc.

In an exemplary embodiment, the combined effects of the differing antenna orientations can provide for a highly directional antenna radiation pattern. Different antennae can have varied sizes and shapes that can be dictated by the needs of the particular shape or configuration of the resultant radiation pattern.

In an alternate embodiment of the improved communication system, a similar configuration to the first embodiment can be used, but with the particle generator being used to excite a plurality of ionized particles to an excitation level that are not associated with a data signal being transmitted, but rather as random noise associated with the ionic discharge arc at the edges of the antennas. In an exemplary embodiment, after forming the ionized particles into an unmodulated directed particle beam using reflectors as described above, the unmodulated beam can be modulated by applying a varying voltage, that can be uniquely associated with a data signal to be transmitted, along the length of the waveguide. As in the first embodiment, the modulated ionized particle beam can then be directed toward a charge transformer similar to that described in the first embodiment, wherein the electrons of the excited particle beam can be slowed, and a continuous wavefront can be created at the output of the charge transformer which propagates toward and is received and demodulated by a receiver.

The above description is presented to enable a person skilled in the art to make and use the systems and methods described herein, and is provided in the context of a particular application and its requirements. Various modifications to the embodiments will be readily apparent to those skilled in the art, and the generic principles defined herein may be applied to other embodiments and applications without departing from the spirit and scope of the claims. Thus, there is no intention to be limited to the embodiments shown, but rather to be accorded the widest scope consistent with the principles and features disclosed herein.

What is claimed is:

1. A method of communicating, comprising:
    generating a data signal to be communicated;
    generating a high frequency carrier signal;
    combining the high frequency carrier signal with the data signal to create a modulated RF signal;
    transmitting the modulated RF signal to at least one directional antenna that is oriented in a principal plane;
    amplifying the modulated RF signal to a high enough voltage such that ionic fields are created at the edge of the directional antenna;
    increasing the voltage further to induce discharge arcing on at least one edge of the directional antenna, thereby creating a modulated particle beam that is oriented in the principal plane of the directional antenna;
    providing a particle generator comprising a magnetron, a waveguide and a covering member;
    powering the magnetron by a non-sinusoidal excitation signal to produce plural energized particles including broad band radio frequencies below, above and including the typical 2.45 GHz frequency of a magnetron;
    directing the plural energized particles down the waveguide toward the covering member;
    directing the modulated particle beam from the directional antenna down the waveguide toward the covering member;
    inducing the creation of radiated modulated EM waves by combining the modulated particle beam from the directional antenna and the plural energized particles from the magnetron; and
    emitting the modulated EM waves so that they can be received in a receiver for demodulating the modulated EM waves in the receiver, and extracting the data signal.

2. A method of communicating, comprising:
    generating an unmodulated particle beam, comprising:
        generating a high frequency carrier signal;
        transmitting the high frequency carrier signal to at least one directional antenna that is oriented in a principal plane;
        amplifying the high frequency carrier signal to a high voltage such that ionic fields are created at the edge of the directional antenna;
        increasing the voltage further to induce discharge arcing on at least one edge of the directional antenna, thereby creating an unmodulated particle beam that is oriented in the principal plane of the directional antenna;
    generating a modulated data signal, comprising:
        generating a data signal to be communicated; and
        modulating the data signal by use of a magnetron powered by a non-sinusoidal excitation signal that drives the magnetron to become a broad band signal generator having frequencies below, above and at the typical 2.45 GHz frequency of a magnetron to generate plural energized particles;
    combining the modulated data signal and the unmodulated particle beam to create a modulated particle beam;
    directing the modulated particle beam to impinge upon an incident surface of a charge transformer;
    inducing radiated modulated EM waves;
    receiving the modulated EM waves in a receiver;
    demodulating the modulated EM waves in the receiver; and
    extracting the data signal.

3. A communications system, comprising:
    a particle generator comprising a magnetron arranged and configured to generate plural energized particles;
    an excitation signal generator configured and adapted to produce a non-sinusoidal excitation signal to power the magnetron in order to produce broad band radio frequency emissions below, above and including the typical 2.45 GHz frequency of a magnetron;
    a covering member configured to receive the plural energized particles from the charged particle generator and to output energized particles that include particles having substantially zero charge,
    wherein the charged particle generator is configured to direct the plural energized particles through the covering member; and
    a receiver to receive the energized particles including the particles having substantially zero charge.

4. The system of claim 3, comprising:
    a waveguide and a housing, the housing having an opening, the waveguide in communication with the opening in the housing and configured to guide the plural energized particles created by the charged particle generator.

5. The system of claim 4, wherein the waveguide is configured to modulate the plural energized particles with a modulating data signal.

6. The system according to claim 3, wherein the excitation signal comprises at least one of a VAC square wave and a chopped alternating current signal.

7. The system according to claim 6, wherein the excitation signal is configured and adapted to power the magnetron in order to generate radio frequencies having a bandwidth on the order of 0 to about 10 GHz.

8. The system according to claim 4, wherein the covering member is composed of a material different than the housing.

9. The system according to claim 3, wherein the covering member comprises an electropositive sheet.

10. The system according to claim 3, wherein the covering member comprises an electronegative dielectric material.

11. The system according to claim 3, wherein the covering member comprises at least one from the group of Delrin, polycarbonate, quartz and glass.

12. The system according to claim 4, wherein the magnetron is positioned within the housing such that there is about a three-inch gap between the top of the magnetron's cathode and the housing.

13. The system according to claim 4, wherein the magnetron is positioned in the housing about two (2) inches in front of the covering member that at least partially covers the opening in the housing.

14. The system according to claim 4, wherein the housing has a charged particle emitter portion, and a throat section of a waveguide launcher area, and the system further includes a cone-like horn portion having an aperture, wherein the magnetron is located within the charged particle emitter portion and the covering member is located in at least one of the throat section and the horn portion; the system further including at least one antenna having an edge, the antenna configured and arranged to induce discharge arcing on at least the edge.

15. The system according to claim 4, wherein the housing is formed of metal.

16. The method of claim 1 wherein the directional antenna is located in the waveguide.

17. The method of claim 2 wherein the modulated data signal and the unmodulated particle beam are combined in a waveguide.

* * * * *